US010431135B2

(12) United States Patent
Shi

(10) Patent No.: US 10,431,135 B2
(45) Date of Patent: Oct. 1, 2019

(54) SCANNING DRIVING CIRCUIT

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 223 days.

(21) Appl. No.: 15/540,983

(22) PCT Filed: May 12, 2017

(86) PCT No.: PCT/CN2017/084119
§ 371 (c)(1),
(2) Date: Jun. 29, 2017

(87) PCT Pub. No.: WO2018/192026
PCT Pub. Date: Oct. 25, 2018

(65) Prior Publication Data
US 2018/0308407 A1 Oct. 25, 2018

(51) Int. Cl.
*G11C 19/00* (2006.01)
*G09G 3/20* (2006.01)

(52) U.S. Cl.
CPC ....... *G09G 3/20* (2013.01); *G09G 2310/0286* (2013.01); *G09G 2310/0289* (2013.01); *G09G 2310/067* (2013.01); *G09G 2320/045* (2013.01)

(58) Field of Classification Search
CPC .......... G09G 3/20; G09G 3/36; G09G 3/3607; G09G 3/038; G09G 3/3648; G09G 3/3677; G09G 3/3674; G09G 5/00; G09G 5/18; G02F 1/13306; G02F 1/13454; H03K 3/00; H03K 3/012; H03K 3/015; H03K 5/01; H03K 17/16; H03K 17/56; G11C 19/00;
(Continued)

(56) References Cited

U.S. PATENT DOCUMENTS

2010/0188385 A1 7/2010 Boiko
2015/0187302 A1 7/2015 Dai
(Continued)

FOREIGN PATENT DOCUMENTS

CN 205069085 U 3/2016
CN 106057161 A 10/2016

*Primary Examiner* — Chanh D Nguyen
*Assistant Examiner* — Nguyen H Truong
(74) *Attorney, Agent, or Firm* — Andrew C. Cheng

(57) ABSTRACT

The disclosure provides a scanning driving circuit including a plurality of scanning driving units connected in turn, each scanning driving unit includes a scanning signal output terminal for outputting a high or low voltage level scanning signal; a pull-up circuit, for controlling the output of a high voltage level scanning signal; a transfer circuit, for outputting the staged transmission signal at a high voltage level; a pull-up control circuit, for charging the pull-up control signal point to pull the potential to a high voltage level; a pull-down holding circuit, for maintaining a pull-up control signal point and scanning signal at a low voltage level; a bootstrap circuit, for raising the potential of the pull-up control signal point to prevent leakage, and thus prevent the circuit scanning driving circuit from malfunction caused by the threshold voltage being slightly negative.

8 Claims, 5 Drawing Sheets

(58) Field of Classification Search
CPC ......... G11C 19/28; G11C 19/184; G11C 5/06; H04N 13/04; H04N 13/0454; G06F 3/038
See application file for complete search history.

(56) References Cited

U.S. PATENT DOCUMENTS

| | | | | |
|---|---|---|---|---|
| 2015/0310819 | A1* | 10/2015 | Xiao | G11C 19/28<br>345/212 |
| 2015/0348596 | A1* | 12/2015 | Yao | G09G 3/20<br>377/54 |
| 2016/0171949 | A1 | 6/2016 | Dai | |
| 2016/0275886 | A1 | 9/2016 | Dai et al. | |
| 2016/0284303 | A1 | 9/2016 | Dai | |
| 2017/0047039 | A1 | 2/2017 | Lu | |
| 2017/0124971 | A1* | 5/2017 | Tu | G09G 3/3648 |
| 2018/0182337 | A1 | 6/2018 | Lv et al. | |
| 2018/0218698 | A1 | 8/2018 | Li et al. | |

* cited by examiner

| Timing setting | | Voltage setting (12 signals) | | |
|---|---|---|---|---|
| Resolution | 8K4K | Signals | H | L |
| Gate number | 4320 | STV | 28v | -5~ -7v |
| CK unmber | 8 | CK1~8 | 28v | -5~ -7v |
| Gate line per CK | 540 | LC | 28v | -10~ -14v |
| STV width (us) | 30 | VSS1 | -5~ -7v | |
| CK1 delay STV time (us) | 3.75 | VSS2 | --10~ -14v | |
| CK width (us) | 12~15 | | | |
| CK delay time(CDT) (us) | 3.75 | | | |
| CK period(us) | 30 | | | |
| Duty cycyle | 40~50% | | | |
| Data time (us) | 3.75 | | | |
| Blanking time (us) | 451.67 | | | |

| Timing setting | | Voltage setting (12 signals) | | |
|---|---|---|---|---|
| Resolution | 8K4K | Signals | H | L |
| Gate number | 4320 | STV | 28v | -5~ -7v |
| CK unmber | 8 | CK1~8 | 28v | -5~ -7v |
| Gate line per CK | 540 | LC | 28v | -10~ -14v |
| STV width (us) | 30 | VSS1 | -5~ -7v | |
| CK1 delay STV time (us) | 3.75 | VSS2 | --10~ -14v | |
| CK width (us) | 12~15 | | | |
| CK delay time(CDT) (us) | 3.75 | | | |
| CK period(us) | 30 | | | |
| Duty cycyle | 40~50% | | | |
| Data time (us) | 3.75 | | | |
| Blanking time (us) | 451.67 | | | |

SCANNING DRIVING CIRCUIT

TECHNICAL FIELD

The disclosure is related to the technical field of display technology, and more particular to a scanning driving circuit.

DESCRIPTION OF RELATED ART

GOA (Gate Driver on Array) technology is conducive to the display narrow frame design and cost reduction, has been widely used and researched. Indium gallium zinc oxide (IGZO) has high mobility and good device stability, can reduce the complexity of the scanning driving circuit. Due to the high mobility of IGZO, it makes the thin film transistor size of the scanning driving circuit be relatively small, is conducive to manufacture the narrow frame display; second, due to the device stability of IGZO, it can be used to reduce the power for stabilizing the thin film transistor performance and the number of the thin film transistors, so that the circuit is simple and low power consumption. However, due to the characteristic of IGZO material itself, the initial threshold voltage Vth is easy to be negative, and the influence of light will cause serious negative drift of the threshold voltage Vth, which may cause the scanning driving circuit malfunction.

SUMMARY

The technical problem to be solved by the present invention is to provide a scanning driving circuit to prevent the circuit scanning driving circuit from malfunction caused by the threshold voltage being slightly negative.

To solve the above technical problem, one technical solution adopted by the disclosure is to provide a scanning driving circuit, the scanning driving circuit includes a plurality of scanning driving units connected in turn, each of which includes:

a scanning signal output terminal, for outputting a high voltage level scanning signal or a low voltage level scanning signal;

a pull-up circuit, for receiving a staged clock signal and controlling the scanning signal output terminal to output a high voltage level scanning signal in accordance with the staged clock signal;

a transfer circuit, for connecting the pull-up circuit for outputting a high voltage level transmission signal;

a pull-up control circuit, connected to the transfer circuit, for charging the pull-up control signal point to pull the potential of the pull-up control signal point to a high voltage level;

a pull-down holding circuit, connected to the pull-up control circuit, for maintaining the pull-up control signal point and a scanning signal outputted from the scanning signal output terminal at a low voltage level;

a bootstrap circuit, for raising the potential of the pull-up control signal point; and a pull-down circuit, connected the transfer circuit and the pull-down holding circuit, for receiving a latter staged transmission signal and controlling the scanning signal output terminal to output a low voltage level scanning signal in accordance with the latter staged transmission signal;

the pull-up circuit including a first controllable switch, a first terminal of the first controllable switch receiving the staged clock signal and being connected to the transfer circuit, a control terminal of the first controllable switch connected to the transfer circuit, a second terminal of the first controllable switch connected to the pull-down holding circuit and the scanning signal output terminal.

To solve the above technical problem, one technical solution adopted by the disclosure is to provide a scanning driving circuit, the scanning driving circuit includes a plurality of scanning driving units connected in turn, each of which includes:

a scanning signal output terminal, for outputting a high voltage level scanning signal or a low voltage level scanning signal;

a pull-up circuit, for receiving a staged clock signal and controlling the scanning signal output terminal to output a high voltage level scanning signal in accordance with the staged clock signal;

a transfer circuit, for connecting the pull-up circuit for outputting a high voltage level transmission signal;

a pull-up control circuit, connected to the transfer circuit, for charging the pull-up control signal point to pull the potential of the pull-up control signal point to a high voltage level;

a pull-down holding circuit, connected to the pull-up control circuit, for maintaining the pull-up control signal point and a scanning signal outputted from the scanning signal output terminal at a low voltage level; and a bootstrap circuit, for raising the potential of the pull-up control signal point.

Distinguishing from the current technology, the beneficial effects of this disclosure is that the scanning driving circuit of this disclosure may prevent electrical leakage by the pull-up circuit, the transfer circuit, the pull-up control circuit, the pull-down holding circuit, the pull-down circuit and the bootstrap circuit, thereby preventing the scanning driving circuit from malfunction caused by the threshold voltage being slightly negative.

DETAILED DESCRIPTION OF EMBODIMENTS

Figure 1:
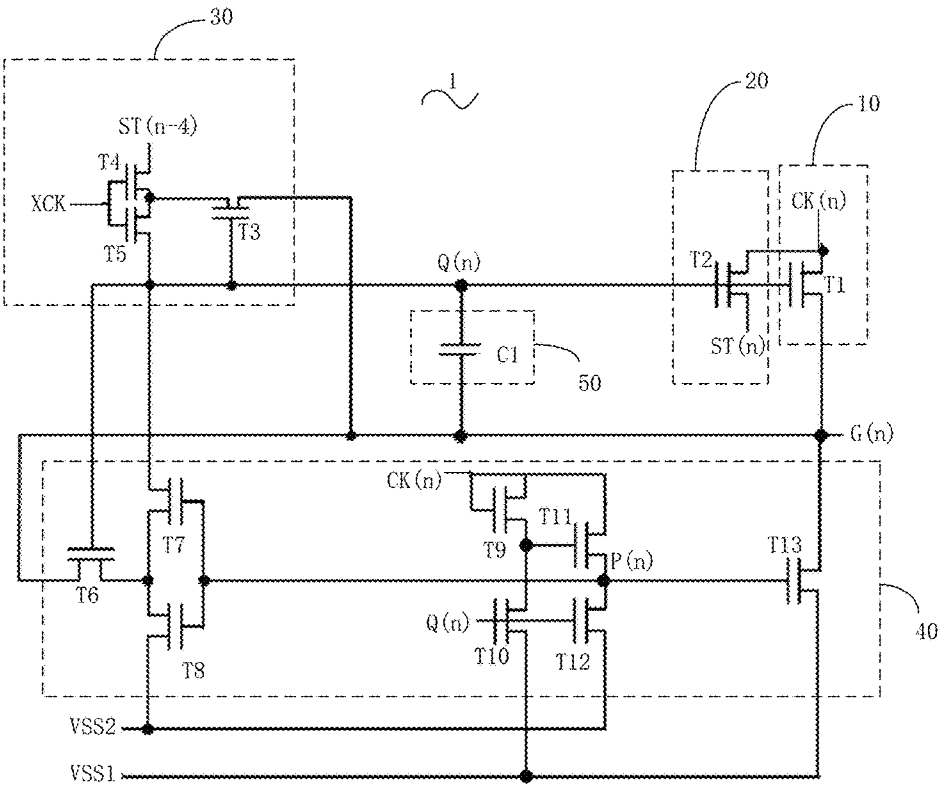
FIG. 1 is a circuit diagram of a first embodiment of the scanning driving circuit of the disclosure.

Referring to FIG. 1, there is shown a circuit diagram of a first embodiment of the scanning driving circuit of this disclosure. The scanning driving circuit includes a plurality of scanning driving units 1, each of which includes a scanning signal output terminal G(n), for outputting a high voltage level scanning signal or a low voltage level scanning signal;

a pull-up circuit 10, for receiving the staged clock signal CK(n) and controlling the scanning signal output terminal G(n) to output a high voltage level scanning signal in accordance with the staged clock signal CK(n);

a transfer circuit 20, for connecting the pull-up circuit 10, for outputting a high voltage staged transmission signal ST(n);

a pull-up control circuit 30, for connecting the transfer circuit 20, for charging the pull-up control signal point Q(n) to pull the potential of the pull-up control signal point Q(n) to a high voltage level;

a pull-down holding circuit 40, connected to the pull-up control circuit 30 for maintaining the pull-up control signal point Q(n) and the scanning signal outputted from the scanning signal output terminal G(n) at a low voltage level;

a bootstrap circuit 50, for raising the potential of the pull-up control signal point Q(n).

The scan driving unit 1 further includes a pull-down circuit 60, which is connected to the transfer circuit 20 and the pull-down holding circuit 40, for receiving a latter staged transmission signal ST(n+4) and controlling the scanning signal output terminal G(n) to output a low voltage level scanning signal in accordance with the staged transmission signal ST(n+4).

The pull-up circuit 10 includes a first controllable switch T1, a first terminal of the first controllable switch T1 receives the staged clock signal CK(n) and is connected to the transfer circuit 20, a control terminal of the controllable switch T1 is connected to the transfer circuit 20, and a second terminal of the first controllable switch T1 is connected to the pull-down holding circuit 40 and the scanning signal output terminal G(n).

The transfer circuit 20 includes a second controllable switch T2, a control terminal of the second controllable switch T2 is connected to the control terminal of the first controllable switch T1, a first terminal of the second controllable switch T2 is connected to the first terminal of the first controllable switch T1 a second terminal of the second controllable switch T2 out puts a staged transmission signal ST(n).

The pull-up control circuit 30 includes third to fifth controllable switches T3-T5, a control terminal of the third controllable switch T3 is connected to the control terminal of the second controllable switch T2, a fifth controllable switch T5, and the pull-down holding circuit 40, a first terminal of the third controllable switch T3 is connected to a second terminal of the fourth controllable switch T4 and a first terminal of the fifth controllable switch T5, a second terminal of the third controllable switch T3 is connected to the pull-down holding circuit 40, and a first terminal of the fourth controllable switch T4 receives the former staged transmission signal ST(n−4), a control terminal of the controllable switch T4 is connected to a control terminal of the fifth controllable switch T5 and receives a first clock signal XCK.

The pull-down holding circuit 40 includes sixth to thirteenth controllable switches T6-T13, a control terminal of the sixth controllable switch T6 is connected to the second terminal of the fifth controllable switch T5, a first terminal of the controllable switch T6 is connected to the second terminal of the third controllable switch T3, a second terminal of the sixth controllable switch T6 is connected to a second terminal of the seventh controllable switch T7 and a first terminal of the eighth controllable switch T8, a first terminal of the And of the seventh controllable switch T7 is connected to the second terminal of the fifth controllable switch T5, a control terminal of the seventh controllable switch T7 is connected to a control terminal of the eighth controllable switch T8, a second terminal of the eighth controllable switch T8 is connected to a second voltage terminal VSS2, a control terminal of the ninth controllable switch T9 is connected to a first terminal of the ninth controllable switch T9 and a first terminal of the eleventh controllable switch T11 and receives the staged clock signal CK(n), a second terminal of the ninth controllable switch T9 is connected to a first terminal of the tenth controllable switch T10 and the control terminal of the tenth controllable switch T11, a control terminal of the tenth controllable switch T10 is connected to a control terminal of the twelfth controllable switch T12 and the pull-up control signal point Q(n), a second terminal of the tenth controllable switch T10 is connected to a first voltage terminal VSS1, a second terminal of the eleventh controllable switch T11 is connected to a first terminal of the twelfth controllable switch T12, a control terminal of the thirteenth controllable switch T13, and the control terminal of the eighth controllable switch T8, a second terminal of the twelfth controllable switch T12 is connected to the second voltage terminal VSS2, a first terminal of the thirteenth controllable switch T13 is connected to the second terminal of the first controllable switch T1, the scanning signal output terminal G(n), and the first terminal of the sixth controllable switch T6, a second terminal of the thirteenth controllable switch T13 is connected to the first voltage terminal VSS1.

The bootstrap circuit 50 includes a bootstrap capacitor C1, one terminal of which is connected to the control terminal of the third controllable switch T3, and the other terminal of the bootstrap capacitor C1 is connected to the third controllable switch the second terminal of T3.

In this embodiment, the first to thirteenth controllable switches T1-T13 are N-type thin film transistors, the control terminals, the first terminals, and the second terminals of the first to thirteenth controllable switches T1-T13 respectively correspond to the gates, the drains, and the sources of the N-type thin film transistors. In other embodiments, the first to thirteenth controllable switches may also be other types of switches as long as the objective of the disclosure can be achieved.

In this embodiment, a phase of the staged clock signal CK(n) is opposite to a phase of the first clock signal XCK, which are a group of high frequency AC power supplies. The first voltage terminal VSS1 and the second voltage terminal VSS2 are DC power supplies. This disclosure is illustrated by an example of 8K4K display in which eight clock signals are used, an overlap time between each of the two clock signals is 3.75 microseconds, a trigger signal STV has a pulse for each frame, and a pulse width is 30 microseconds, an overlap time between the trigger signal STV and the clock signal CK is 3.75 microseconds.

In this embodiment, a high potential of the clock signal CK is 28V and a low potential of which is −10V. Due to the fact that this embodiment adopts 8 clock signals CK, a clock signal CK1 is opposite to CK5, a clock signal CK2 is opposite to CK6, a clock signal CK3 is opposite to CK7, and a clock signal CK4 is opposite to CK8. The former staged transmission signals (N−4) is connected to a former fourth staged transmission signals, for example, when a current stage is tenth stage, thus ST(N)=ST(10), ST(N−4)=ST(6), that is, the first terminal of the fourth controllable switch T4 and a 6th-staged transmission signal are connected. Wherein, the first terminals of each fourth controllable switch T4 of the first four stages are connected to the trigger signal STV. A voltage of the first voltage terminal VSS1 is −5V, and a voltage of the second voltage terminal VSS2 is −10V.

Figure 2:
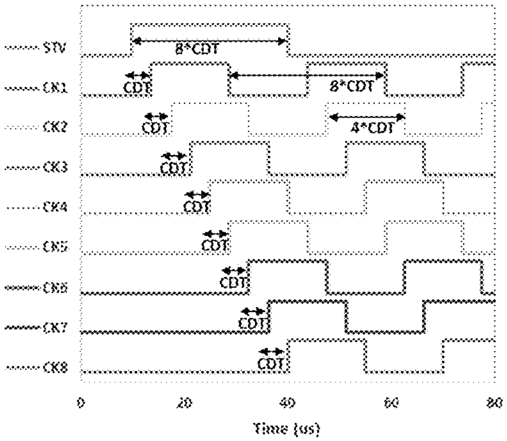
FIG. 2 is a relation diagram of signal waveform and electrical potential of FIG. 1.
Figure 3:
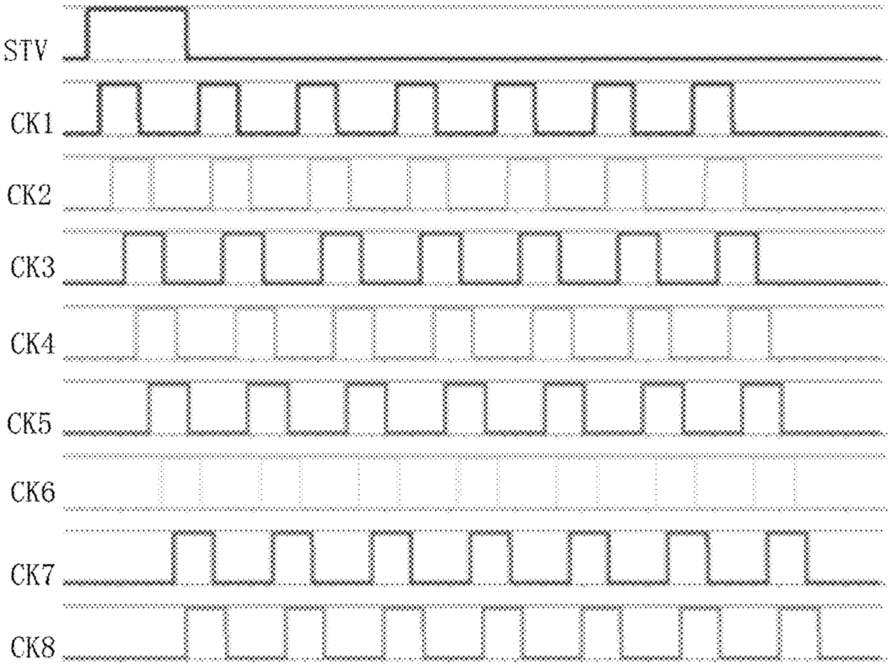
FIG. 3 is a schematic diagram of a simulation signal waveform of FIG. 1.
Figure 4:
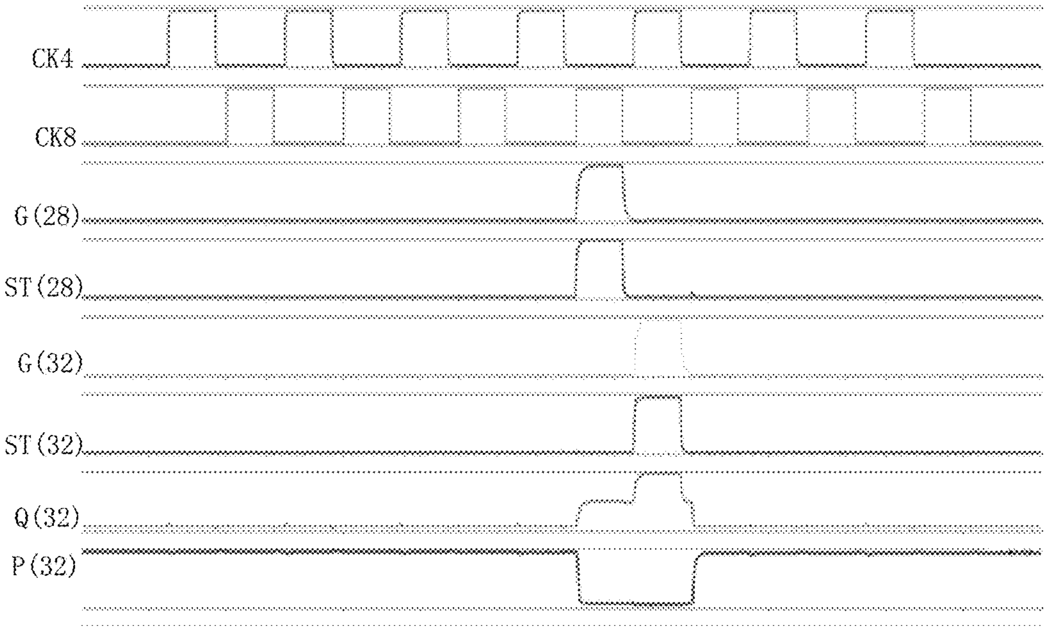
FIG. 4 is a schematic diagram of a simulation signal waveform of the 32th-staged scanning driving unit of the scanning driving circuit of the disclosure.

Referring to FIGS. 2 to 4, the scanning driving circuit of this embodiment will be described by taking the operation of the 32th-staged scanning driving unit as an example. That is, G(N)=G(32), ST(N−4)=ST(28), the scanning signal outputted from the scanning signal output terminal G(32) is controlled by a clock signal CK8, and a staged transmission signal ST (28) is controlled by a clock signal CK4, and the first clock signal XCK is the clock signal CK4.

When the staged transmission signal ST(28) is at a high potential, the clock signal CK4 is at a high potential, the fourth controllable switch T4 and the fifth controllable switch T5 are turned on; when a high potential of the staged transmission signal ST(28) is transmitted to a pull-up control signal point Q(32), the pull-up control signal point Q(32) is at a high potential, then first controllable switch T1 is turned on, at this time the clock signal CK8 is at a low potential, so the scanning signal outputted from the scanning signal output terminal G(32) is at a low potential, and at this time the ninth controllable switch T9 and the twelfth controllable switch T12 are turned on, and the second voltage terminal VSS2 pulls down the potential of the pull-down control signal point P(32), at this time the thirteenth controllable switch T13, the seventh controllable switch T7, and the eighth controllable switch T8 are turned off, so that the first voltage terminal VSS1 does not pull down the potential of the scanning signal outputted from the scanning signal output terminal G(32).

When the staged transmission signal ST(28) is at a low potential, the clock signal CK4 is at a low potential, and the fourth controllable switch T4 and the fifth controllable switch T5 are turned off. At this time, the clock signal CK8 is at a high potential, the scanning signal outputted from the scanning signal output terminal G(32) is at a high potential, and the pull-up control signal point Q(32) is pulled up to a higher potential by the coupling effect of the capacitance C1, a pull-down control signal point P(32) is remained at a low potential.

Here, it is necessary to explain how the scanning driving circuit of this disclosure prevents the circuit scanning driving circuit from malfunction caused by the threshold voltage being slightly negative.

In the present scanning driving circuit, when the threshold voltage of the pull-up control circuit 30 and the pull-down holding circuit 40 is too negative, the high potential of the pull-up control signal point Q(32) leaks to low potential from the pull-up control circuit 30 and the pull-down holding circuit 40, the high potential of the scanning signal outputted from the scanning signal output terminal G(32) also leaks to low potential, thus, it causes the circuit to fail to output a normal waveform, so that the circuit is malfunctioned.

The scanning driving circuit of this disclosure is effective for preventing leakage, when the threshold voltage Vth of the pull-up control circuit 30 is negative, the third controllable switch T3 is turned on, and a voltage of the first terminal of the fifth controllable switch T5 is 28V, the clock signal CK4 is at a low potential, so the voltage is −10V, then the voltage Vgs between gate and source of the fifth controllable switch T5=−10V−28V=−38V, as long as the threshold voltage Vth of the fifth controllable switch T5 is not less than −38V, thus the fifth controllable switch T5 is in the off state, so the high potential of the pull-up control signal point Q(32) will not leak from the pull-up control circuit 30, the principle for preventing the leakage of the pull-down holding circuit 40 is the same, so it will not be described here.

For the electrical leakage of the thirteenth controllable switch T13, if the potential of the first voltage terminal VSS1 is −5V, and the potential of the second voltage terminal VSS2 is −10V, and then the pull-down control signal point P (32) has a potential of −10V, and the voltage Vgs between the gate and the source of the thirteenth controllable switch T13 is −10V−(−5V)=−5V, as long as the threshold voltage Vth of the thirteenth controllable switch T13 is not less than −5V, the fifth controllable switch T5 is in the off state, so that the high potential of the scanning signal outputted from the scanning signal output terminal G(32) does not leak from the thirteenth controllable switch T13.

When the clock signal CK8 is at a low potential, the scanning signal outputted from the scanning signal output terminal G (32) is pulled down to low potential, at the meantime, when the clock signal CK4 is at a high potential, the low potential of the staged transmission signal ST(28) is transmitted to the pull-up control signal point Q(32), the pull-up control signal point Q(32) is pulled to low potential. After the time, the clock signal CK8 is periodically at a high potential, and the pull-down control signal point P(32) is periodically at a high potential, the thirteenth controllable switch T13, the controllable switch T7, and the eighth controllable switch T8 are periodically turned on, then the pull-up control signal point Q(32) can well maintain the potential from the second voltage terminal VSS2, and the scanning signal outputted from the scanning signal output terminal G(32) can well maintain the potential from the first voltage terminal VSS1.

Figure 5:
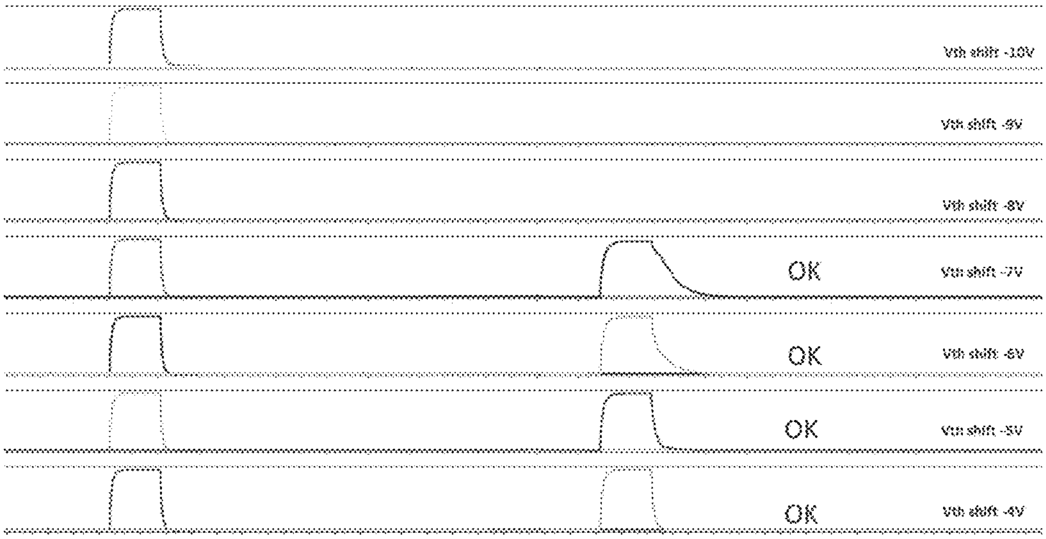
FIG. 5 is a schematic diagram of a simulation signal waveform of endurance of FIG. 1.

Referring to FIG. 5, there is shown a schematic diagram of an endurance simulation signal waveform of a scanning driving circuit according to this disclosure. As shown in FIG. 5, when the threshold voltage this −7V, the scanning driving circuit can still work normally, indicating that the scanning driving circuit of this application is very good in endurance.

The scanning driving circuit prevents electrical leakage by the pull-up circuit, the transfer circuit, the pull-up control circuit, the pull-down holding circuit, the pull-down circuit, and the bootstrap circuit, thereby preventing the scanning driving circuit from malfunction caused by the threshold voltage being slightly negative.

Figure 6:
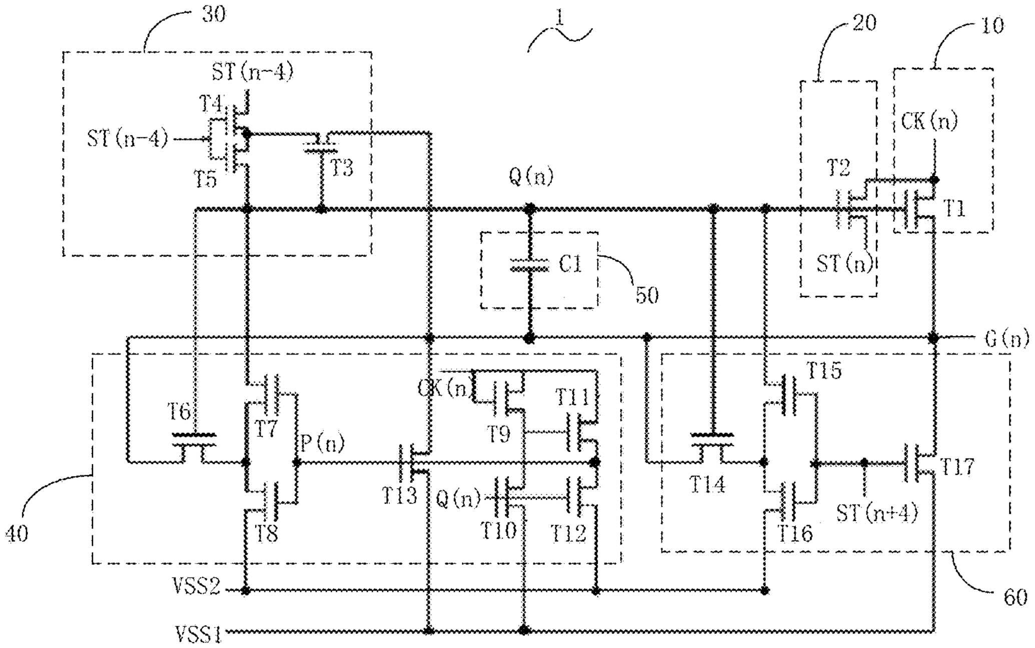
FIG. 6 is a circuit diagram of a second embodiment of the scanning driving circuit of the disclosure.

Referring to FIG. 6, there is shown a circuit diagram of a second embodiment of the scanning driving circuit of this disclosure. The second embodiment of the scanning driving circuit differs from the first embodiment in that the pull-up control circuit 30 includes third to fifth controllable switches T3-T5, the control terminal of the third controllable switch T3 is connected to the control terminal of the second controllable switch T2, the second terminal of the fifth controllable switch T5, and the pull-down holding circuit 40; the first terminal of the third controllable switch T3 is connected to the second terminal of the fourth controllable switch T4 and the first terminal of the fifth controllable switch T5, the second terminal of the third controllable switch T3 is connected to the pull-down holding circuit 40. The first terminal of the fourth controllable switch T4 receives the former staged transmission signal ST(n−4), the control terminal of the fourth controllable switch T4 is connected to the control terminal of the fifth controllable switch T5 and receives the former staged transmission signal ST (n−4).

The pull-down holding circuit 40 includes sixth to thirteenth controllable switches T6-T13, the control terminal of the sixth controllable switch T6 is connected to the second terminal of the fifth controllable switch T5, the first terminal of the sixth controllable switch T6 is connected to the second terminal of the third controllable switch T3, the second terminal of the sixth controllable switch T6 is connected to the second terminal of the seventh controllable switch T7 and the first terminal of the eighth controllable switch T8, the first terminal of the seventh controllable switch T7 is connected to the second terminal of the fifth controllable switch T5, the control terminal of the seventh controllable switch T7 is connected to the control terminal of the eighth controllable switch T8, the second terminal of the eighth controllable switch T8 is connected to the second voltage terminal VSS2. The control terminal of the ninth controllable switch T9 is connected to the first controllable switch T9 and the first terminal of the eleventh controllable switch T11 and receives the staged clock signal CK(n), the second terminal of the ninth controllable switch T9 is connected to the first terminal of the tenth controllable switch T10 and the control terminal of the eleventh controllable switch T11, the control terminal of the tenth controllable switch T10 is connected to the control terminal of the controllable switch T12 and the pull-up control signal point Q(n), the second terminal of controllable switch T10 is connected to the first voltage terminal VSS1, the second terminal of the eleventh controllable switch T11 is connected to the first terminal of the twelfth controllable switch T12, the control terminal of the thirteenth controllable switch T13, and the control terminal of the eighth controllable switch T8; the second terminal of the twelfth controllable switch T12 is connected to the second voltage terminal VSS2, the first terminal of the thirteenth controllable switch T13 is connected to the first terminal of the sixth controllable switch T6, the second terminal of the thirteenth controllable switch T13 is connected to the first voltage terminal VSS1.

The pull-down circuit 60 includes fourteenth to seventeenth controllable switches T14-T17, the control terminal of the fourteenth controllable switch T14 is connected to the first terminal of the fifteenth controllable switch T15 and the control terminal of the second controllable switch T2. The first terminal of the fourteenth controllable switch T14 is connected to the scanning signal output terminal G(n) and the first terminal of and the thirteenth controllable switch T13, the second terminal of the fourteenth controllable switch T14 is connected to the second terminal of the fifteenth controllable switch T15 and the first terminal of the sixteenth controllable switch T16, the control terminal of the fifteenth controllable switch T15 is connected to the control terminal of the sixteenth controllable switch T16 and the control terminal of the seventeenth controllable switch T17 and receives the latter staged transmission signal ST (n+4). The second terminal of the sixteenth controllable switch T16 is connected to the second voltage terminal VSS2, the first terminal of the seventeenth controllable switch T17 is connected to the scanning signal output terminal G(n), the second terminal of the seventeenth controllable switch T17 is connected to the first voltage terminal VSS1.

In this embodiment, the first to seventeenth controllable switches T1-T17 are all N-type thin film transistors, the control terminals, the first terminals, and the second terminals of the first to seventeenth controllable switches T1-T17 respectively correspond to the gates, the drains, and the sources of the N-type thin film transistors. In other embodiments, the first to seventeenth controllable switches may also be other types of switches as long as the objective of this disclosure can be achieved.

In this embodiment, it is assumed that the high potential of the clock signal CK is 28V and the low potential is −10V. The scanning driving circuit adopts 8 clock signals CK, the staged transmission signal ST(N−4) is connected to the former fourth staged transmission signal, for example, when the current stage is the tenth stage, then ST(N)=ST(10), ST (N−4)=ST(6), ST (N+4)=ST(10), that is, the first terminal of the fourth controllable switch T4 and the sixth staged transmission signal ST(6) are connected. The fourth controllable switch T4 of each scanning driving unit 1 of the first four stages is connected to the trigger signal STV, and the last fourth staged transmission signal ST(N+4) is replaced by the trigger signal STV. Here the voltage of the first voltage terminal VSS1 is −5V, and the voltage of the second voltage terminal VSS2 is −10V.

Figure 7:
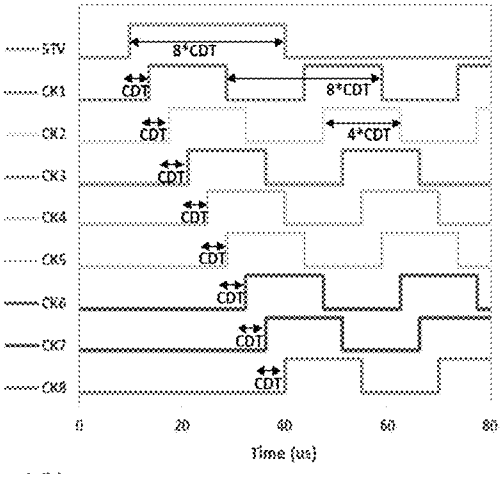
FIG. 7 is a relation diagram of the signal waveform and electrical potential of FIG. 6.
Figure 8:
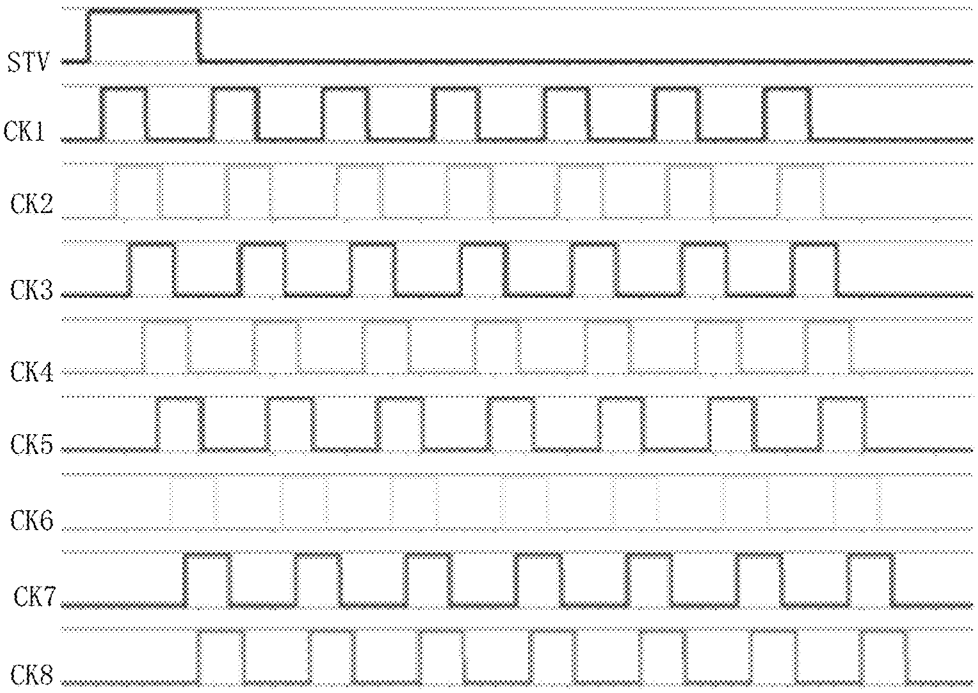
FIG. 8 is a schematic diagram of simulation signal waveform of the simulation of FIG. 6.
Figure 9:
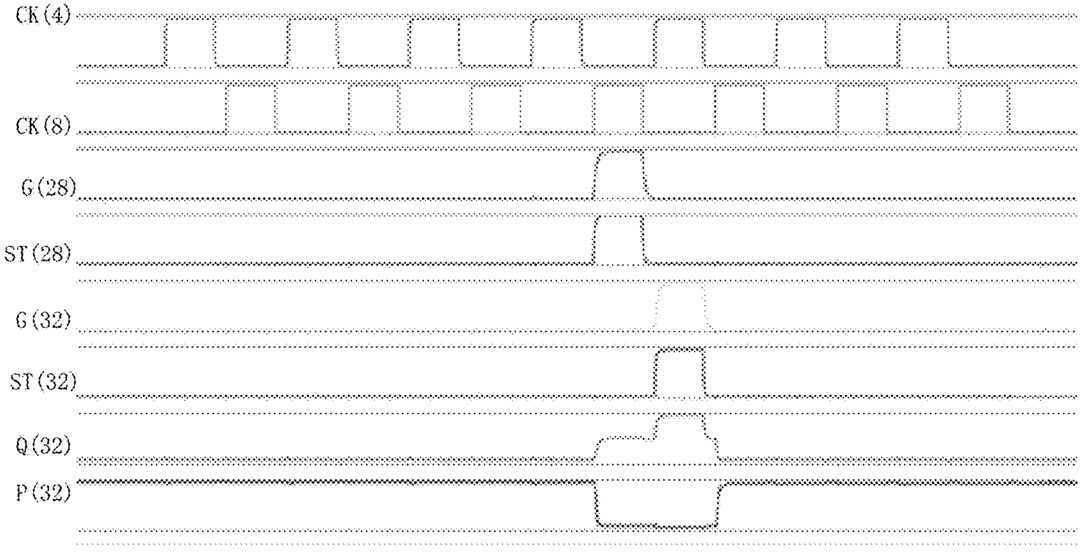
FIG. 9 is a schematic diagram of a simulation signal waveform of the 32th-staged scanning driving unit of the scanning driving circuit of the disclosure.

Referring to FIGS. 7 to 9, the scanning driving circuit of this embodiment will be described by taking the operation principle of the 32nd stage scanning driving unit as an example. That is, G(N)=G(32), ST(N−4)=ST(28), ST(N+4) =ST(36). The scanning signal outputted from the scanning signal output terminal G(32) is controlled by the clock signal CK8, and the staged transmission signal ST(28) is controlled by the clock signal CK4.

When the staged transmission signal ST(28) is at a high potential, the clock signal CK4 is at a high potential, and the fourth controllable switch T4 and the fifth controllable switch T5 are turned on, a high potential of the staged transmission signal ST(28) is transmitted to a pull-up control signal point Q(32), the pull-up control signal point Q(32) is at a high potential, at this time then first controllable switch T1 is turned on, the clock signal CK8 is at a low potential, so the scanning signal outputted from the scanning signal output terminal G(32) is at a low potential, at the same time, the tenth controllable switch T10 and the twelfth controllable switch T12 are turned on, so that the second voltage terminal VSS2 pulls down the potential of the pull-down control signal point P(32), and then the thirteenth controllable switch T13, the seventh controllable switch T7, and the eighth controllable switch T8 are turned off. The low potential of the second voltage terminal VSS2 does not pull down the potential of the scanning signal outputted from the scanning signal output terminal G(32).

When the staged transmission signal ST(28) is at a low potential, the clock signal CK4 is at a low potential, and the fourth controllable switch T4 and the fifth controllable switch T5 are turned off, and at this time the clock signal CK8 is at a high potential, the scanning signal outputted from the scanning signal output terminal G(32) is at a high potential, and the pull-up control signal point Q(32) is pulled up to a higher potential by the coupling effect of the capacitance C1, a pull-down control signal point P(32) is remained at a low potential.

Here, it is necessary to explain how the scanning driving circuit of this disclosure prevents the circuit scanning driving circuit from malfunction caused by the threshold voltage being slightly negative.

When the threshold voltage Vth of the pull-up control circuit 30, the pull-down circuit 60, and the pull-down holding circuit 40 in the present scanning driving circuit is too negative, the high potential of the pull-up control signal point Q(32) leaks to low potential from the pull-up control circuit 30, the pull-down circuit 60, and the pull-down holding circuit 40, the high potential of the scanning signal outputted from the scanning signal output terminal G(32) also leaks to low potential by the pull-down circuit 60 and the pull-down holding circuit 40, thus it causes the circuit to fail to output a normal waveform, so that the circuit is malfunctioned.

The scanning driving circuit of this disclosure is effective for preventing leakage, when the threshold voltage Vth of the pull-up control circuit 30 is too negative, the third controllable switch T3 is turned on, and the voltage of the first terminal of the fifth controllable switch T5 is 28V, the clock signal CK4 is at a low potential, so the voltage is −10V, then the voltage Vgs between the gate and the source of the fifth controllable switch T5=−10V−28V=−38V, as long as the threshold voltage Vth of the fifth controllable switch T5 is not less than −38V, thus the fifth controllable switch T5 is in the off state, so the high potential of the pull-up control signal point Q(32) will not leak from the pull-up control circuit 30, the principle for preventing the leakage of the pull-down holding circuit 40 is the same, so it will not be described here.

For the electrical leakage of the thirteenth controllable switch T13 and the seventeenth controllable switch T17, if the potential of the first voltage terminal VSS1 is −5V, and the potential of the second voltage terminal VSS2 is −10V, then the pull-down control signal point P (32) has a potential of −10V, and the voltage Vgs between the gate and the source of the thirteenth controllable switch T13 is −10V−(−5V)=−5V. As long as the threshold voltage Vth of the thirteenth controllable switch T13 is not less than −5V, the fifth controllable switch T5 is in the off state, so that the high potential of the scanning signal outputted from the scanning signal output terminal G(32) does not leak from the pull-down holding circuit 40. Similarly, if the staged transmission signal ST(36) is −10V, and VSS1 is −5V, and the voltage Vgs between the gate and the source of the seventeenth controllable switch T17 is −5V, then the seventeenth controllable switch T17 is in a good off-state.

When the staged transmission signal ST (36) is at a high potential, the fourteenth to seventeenth controllable switches T14-T17 are turned on, the scanning signal outputted from the scanning signal output terminal G(32) and the pull-up control signal point Q(32) are pulled to a low potential; after that, the clock signal CK8 is periodically at a high potential, then the pull-down control signal point P(32) is periodically at a high potential, the sixth to eighth controllable switches T6-T8 and the thirteenth controllable switch T13 are periodically turned on, then the pull-up control signal point Q(32) can well maintain the potential from the second voltage terminal VSS2, and the scanning signal outputted from the scanning signal output terminal G(32) can well maintain at the potential from the first voltage terminal VSS1.

Figure 10:
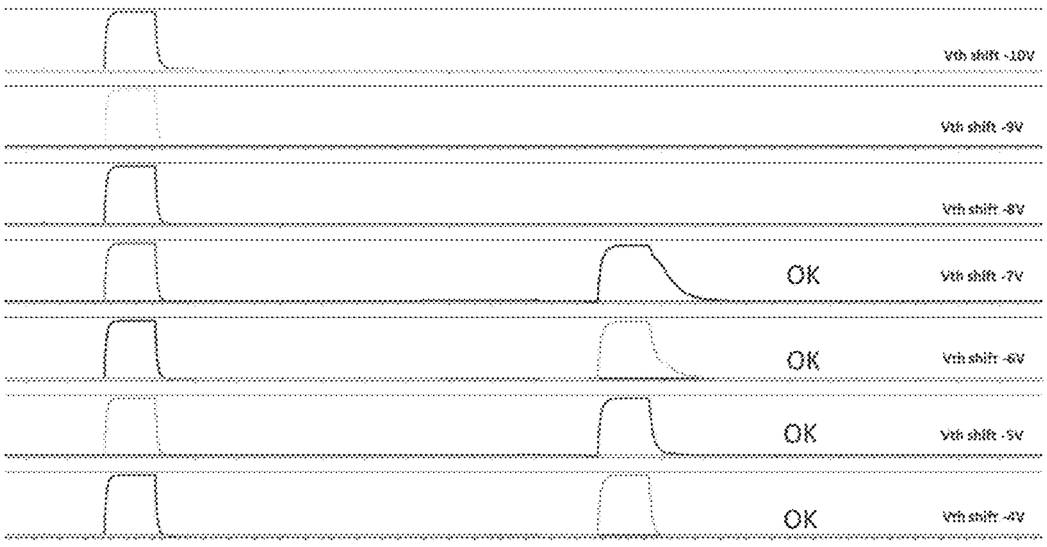
FIG. 10 is a schematic diagram of a simulation signal waveform of endurance of FIG. 6.

Referring to FIG. 10, there is shown a schematic diagram of an endurance simulation waveform of the scanning driving circuit according to this disclosure. As shown in FIG. 10, when the threshold voltage V this −7V, the scanning driving circuit can still work normally, indicating that the scanning driving circuit of this application is very good in endurance.

The scanning driving circuit prevents electrical leakage by the pull-up circuit, the transfer circuit, the pull-up control circuit, the pull-down holding circuit, the pull-down circuit and the bootstrap circuit, thereby preventing the scanning driving circuit from malfunction caused by the threshold voltage being slightly negative.

Although this disclosure is illustrated and described with reference to specific embodiments, those skilled in the art will understand that many variations and modifications are readily attainable without departing from the spirit and scope thereof as defined by the appended claims and their legal equivalents.

What is claimed is:

1. A scanning driving circuit, wherein the scanning driving circuit comprises a plurality of scanning driving units connected in turn, each scanning driving unit comprising:

a scanning signal output terminal, for outputting a high voltage level scanning signal or a low voltage level scanning signal;

a pull-up circuit, for receiving a level clock signal and controlling the scanning signal output terminal to output a high voltage level scan signal in accordance with the level clock signal;

a transfer circuit, connected the pull-up circuit for outputting a staged transmission signal with high voltage level;

a pull-up control circuit, connected to the transfer circuit, for charging a pull-up control signal point to pull electrical potential of the pull-up control signal point to a high voltage level;

a pull-down holding circuit, connected to the pull-up control circuit, for maintaining a low voltage level of the pull-up control signal point and a low voltage level of a scanning signal outputted by the scanning signal output terminal; and a bootstrap circuit, for raising electrical potential of the pull-up control signal point;

the pull-up circuit comprises a first controllable switch, a first terminal of the first controllable switch receives the staged clock signal and is connected to the transfer circuit, a control terminal of the first controllable switch is connected to the transfer circuit, a second terminal of the first controllable switch is connected to the pull-down holding circuit and the scanning signal output terminal;

the transfer circuit comprises a second controllable switch, a control terminal of the second controllable switch is connected to a control terminal of the first controllable switch, a first terminal of the second controllable switch is connected to a first terminal of the first controllable switch and a second terminal of the second controllable switch outputs a staged transmission signal;

the pull-up control circuit comprises third to fifth controllable switches;

a control terminal of the third controllable switch is connected to a control terminal of the second controllable switch, a second terminal of the fifth controllable switch, and the pull-down holding circuit;

a first terminal of the third controllable switch is connected to a second terminal of the fourth controllable switch and a first terminal of the fifth controllable switch;

a second terminal of the third controllable switch is connected to the pull-down holding circuit;

a first terminal of the fourth controllable switch receives a former staged transmission signal; and a control terminal of the fourth controllable switch is connected to a control terminal of the fifth controllable switch and receives a first clock signal.

2. The scanning driving circuit according to claim 1, wherein the scanning driving unit further comprises a pull-down circuit, the pull-down circuit is connected to the transfer circuit and the pull-down holding circuit, for receiving a latter staged transmission signal and controlling a low voltage level scanning signal outputted by the scanning signal output terminal in accordance with latter staged transmission signal.

3. The scanning driving circuit according to claim 1, wherein the pull-down holding circuit comprises sixth to thirteenth controllable switches; a control terminal of the sixth controllable switch is connected to the second terminal of the fifth controllable switch; a first terminal of the sixth controllable switch is connected to the second terminal of the third controllable switch; a second terminal of the sixth controllable switch is connected to a second terminal of the seventh controllable switch and a first terminal of the eighth controllable switch; a first terminal of the seventh controllable switch is connected to the second terminal of the fifth controllable switch; a control terminal of the seventh controllable switch is connected to a control terminal of the eighth controllable switch; the second terminal of the eighth controllable switch is connected to a second voltage terminal; a control terminal of the ninth controllable switch is connected to a first terminal of the ninth controllable switch and a first terminal of the eleventh controllable switch to receive the staged clock signal; a second terminal of the ninth controllable switch is connected to a first terminal of the tenth controllable switch and a control terminal of the eleventh controllable switch; a control terminal of the tenth controllable switch is connected to a control terminal of the twelfth controllable switch and the pull-up control signal point; a second terminal of the tenth controllable switch is connected to a first voltage terminal; a second terminal of the eleventh controllable switch is connected to a first terminal of the twelfth controllable switch, a control terminal of the thirteenth controllable switch, and the control terminal of the eighth controllable switch; a second terminal of the twelfth controllable switch is connected to the second voltage terminal; a first terminal of the thirteenth controllable switch is connected to the second terminal of the first controllable switch, the scanning signal output terminal, and the first terminal of the sixth controllable switch; and a second terminal of the thirteenth controllable switch is connected to the first voltage terminal.

4. The scanning driving circuit according to claim 1, wherein the bootstrap circuit comprises a bootstrap capacitor, one terminal of the bootstrap capacitor is connected to a control terminal of the third controllable switch, and the other terminal of the bootstrap capacitor is connected to the second terminal of the third controllable switch.

5. The scanning driving circuit according to claim 1, wherein the pull-up control circuit comprises the third to the fifth controllable switches, the control terminal of the third controllable switch is connected to the control terminal of the second controllable switch, the second terminal of the fifth controllable switch, and the pull-down holding circuit, the first terminal of the third controllable switch is connected to the second terminal of the fourth controllable switch and the first terminal of the fifth controllable switch, the second terminal of the third controllable switch is connected to the pull-down holding circuit, the first terminal of the fourth controllable switch receives a former staged transmission signal, a control terminal of the fourth controllable switch is connected to a control terminal of the fifth controllable switch and receives the former staged transmission signal.

6. The scanning driving circuit according to claim 5, wherein the pull-down holding circuit comprises sixth to thirteenth controllable switches, a control terminal of the sixth controllable switch is connected to a second terminal of the fifth controllable switch, a second terminal of the sixth controllable switch is connected to a second terminal of the third controllable switch, and the second terminal of the sixth controllable switch is connected to a second terminal of the seventh controllable switch and a first terminal of the eighth controllable switch, a first terminal of the seventh controllable switch is connected to a second terminal of the fifth controllable switch, a control terminal of the seventh controllable switch is connected to a control terminal of the eighth controllable switch, and a second terminal of the eighth controllable switch is connected to the second voltage terminal, a control terminal of the ninth controllable switch is connected to a first terminal of the ninth controllable switch and a first terminal of the eleventh controllable switch and receives the staged clock signal, a second terminal of the ninth controllable switch is connected to a first terminal of the tenth controllable switch and a control terminal of the eleventh controllable switch, a control terminal of the tenth controllable switch is connected to a control terminal of the twelfth controllable switch and the pull-up control signal point, a second terminal of the tenth controllable switch is connected to the first voltage terminal, a second terminal of the eleventh controllable switch is connected to a first terminal of the twelfth controllable switch, a control terminal of the thirteenth controllable switch, and a control terminal of the eighth controllable switch; a second terminal of the twelfth controllable switch is connected to the second voltage terminal; a first terminal of the thirteenth controllable switch is connected to a first terminal of the sixth controllable switch, a second terminal of the thirteenth controllable switch is connected to the first voltage terminal.

7. The scanning driving circuit according to claim 6, wherein the pull-down circuit comprises fourteenth to seventeenth controllable switches, a control terminal of the fourteenth controllable switch is connected to a first terminal of the fifteenth controllable switch and the control terminal of the second controllable switch; a first terminal of the fourteenth controllable switch is connected to the scanning signal output terminal and the first terminal of the thirteenth controllable switch; a second terminal of the fourteenth controllable switch is connected to a second terminal of the fifteenth controllable switch and a first terminal of the sixteenth controllable switch; a control terminal of the fifteenth controllable switch is connected to a control terminal of the sixteenth controllable switch and a control terminal of the seventeenth controllable switch to receive the latter staged transmission signal; a second terminal of the sixteenth controllable switch is connected to the second voltage terminal, a first terminal of the seventeenth controllable switch is connected to the scanning signal output terminal; and a second terminal of the seventeenth controllable switch is connected to the first voltage terminal.

8. The scanning driving circuit according to claim 5, wherein the bootstrap circuit comprises a bootstrap capacitor, one terminal of the bootstrap capacitor is connected to a control terminal of the third controllable switch, and the other terminal of the bootstrap capacitor is connected to a second terminal of the third controllable switch.

* * * * *